United States Patent [19]
Naruse et al.

[11] Patent Number: 5,641,577
[45] Date of Patent: Jun. 24, 1997

[54] LEAD-FRAME FORMING MATERIAL

[75] Inventors: Yasuhito Naruse; Kiyoshi Kamitani; Akio Uesugi; Tsutomu Kakei, all of Shizuoka; Gouichi Morohoshi, Tokyo, all of Japan

[73] Assignee: Fuji Photo Film Co., Ltd., Kanagawa, Japan

[21] Appl. No.: 403,483

[22] Filed: Mar. 14, 1995

[30] Foreign Application Priority Data

Mar. 14, 1994 [JP] Japan ..................... 6-042672

[51] Int. Cl.$^6$ .................. G03F 7/16; G03F 7/00; H01L 21/48
[52] U.S. Cl. .................. 428/460; 428/463; 428/901
[58] Field of Search .................. 428/246, 460, 428/463, 901

[56] References Cited

U.S. PATENT DOCUMENTS

| | | | |
|---|---|---|---|
| 3,698,620 | 10/1972 | Geyer et al. | 228/6 |
| 4,342,151 | 8/1982 | Guild . | |
| 4,827,118 | 5/1989 | Shibata et al. | 250/211 J |
| 5,098,814 | 3/1992 | Tunney et al. . | |

FOREIGN PATENT DOCUMENTS

| | | | |
|---|---|---|---|
| 0249834 | 12/1987 | European Pat. Off. . | |
| 0325545 | 7/1989 | European Pat. Off. . | |
| 0492952 | 7/1992 | European Pat. Off. . | |
| 0617332A1 | 3/1994 | European Pat. Off. | G03F 7/16 |
| 0617332 | 9/1994 | European Pat. Off. . | |
| 2706901 | 8/1977 | Germany . | |

OTHER PUBLICATIONS

Research Disclosure, vol. 185, No. 1, Sep. 1979 Havant GB, pp. 523–526, J.R. Guild 'Blank and process for the formation of beam leads for IC bonding' Disclosure Nr. 18570.
Patent Abstracts of Japan, vol. 016, No. 540 (P-1450), 10 Nov. 1992 for JP-A-4-205656.
Patent Abstracts of Japan, vol. 013, No. 098 (P-840), 8 Mar. 1989 for JP-A-63-279256.
Patent Abstracts of Japan, vol. 011, No. 390 (E-567), 19 Dec. 1987 for JP-A-62-154766.
Research Disclosure, vol. 180, No. 0, Apr. 1979 Havant GB, p. 161 AN. 'A light-sensitive material having a matting layer'.

*Primary Examiner*—Daniel Zirker
*Attorney, Agent, or Firm*—Sughrue, Mion, Zinn, Macpeak & Seas

[57] ABSTRACT

Disclosed are i) a lead-frame forming material which contains a light-sensitive material comprising (1) a diazo salt light-sensitive resin and (2) a water-insoluble but alkaline water-soluble lipophilic high molecular weight compound, ii) a lead-frame forming material which contains a light-sensitive material comprising a photodimeric light-sensitive composition, and iii) a lead-frame forming material which contains a light-sensitive material comprising (1) a water-insoluble but alkaline water-soluble resin, (2) a compound capable of generating an acid by irradiation with active rays or radiant rays, and (3) a compound containing at least one crosslinkable group by the action of the acid.

1 Claim, No Drawings

LEAD-FRAME FORMING MATERIAL

FIELD OF THE INVENTION

The present invention relates to a lead-frame forming material and, more particularly, to the construction of a negative lead-frame forming material.

BACKGROUND OF THE INVENTION

A lead-frame is a metal frame forming an extension line lead terminal with a die pad which is used for fixing a semiconductor pellet used in a plastic mold IC and a ceramics package IC. There is used for the metal frame, a lead-frame forming metal plate made of alloy mainly containing copper or copper-nickel as a material. In recent years, an element of an active metal series such as titanium and chromium has been added to the material as well. In any event, it is desired that the material used have good mechanical strength, high electric conductivity, high softening temperature, a coefficient of thermal expansion matching the coefficient of thermal expansion of a semiconductor pellet and a package material, secured flatness of a lead, small bending anisotropy, good heat releasing performance, and a low cost. A pattern is formed on the lead-forming metal plate by punching out or by etching with an etching solution. The punching out method can be carried out at a low cost and a precise pattern can be formed by the etching method.

In recent years, development in semiconductor and integrated circuit manufacturing accompanied with an increased demand for electronic parts using lead-frames has resulted in an increased requirement for providing lead-frame having uniform quality in large volume.

In manufacturing lead-frames, there has been used in the past, for example, an alloy plate mainly containing copper or an alloy plate mainly containing copper-nickel, and in order to remove rust preventives applied on the alloy plate, the alloy plate was subjected to a degrease treatment and an acid cleaning treatment. Then, a light-sensitive layer of a dry type film which is generally a negative type, is deposited or a liquid resist which is generally a negative type was coated, and dried on the plate to provide a light-sensitive material layer. After the light-sensitive layer was exposed through a prescribed etching pattern, it was then subjected to a developing treatment and any exposed parts of the light-sensitive layer were removed. Then, the alloy plate was dipped in an etching solution to form a prescribed etching pattern on the alloy plate surface.

For producing pattern-formed lead-frames with uniform quality in large volume by the use of a conventional lead-frame forming material as described above, a great many sheets of lead-frame forming materials have been prepared so far in the following manner: A great many sheets of metallic substrate, e.g., a great number of alloy plates as described above, are subjected to successive degreasing and acid cleaning treatments one after another in a batch treatment, thereby removing rust preventives coated on each sheet of the alloy plate, and each sheet of the thus treated alloy plate is coated with a light-sensitive material of a dry type which is generally a negative type by adhesion or deposition, or coated with a liquid resist which is generally a negative type by a coating method such as spin coating, each followed by drying, to provide a light-sensitive layer on the alloy plate.

The above-described conventional manners for preparing lead-frame forming materials have many problems as described below.

1. In the case of using a dry film, the preparation process is complicated. More specifically, the process comprises laminating a film on both surfaces of a resist, peeling off the film on one surface, adhering the bare surface of the resist to an alloy plate made of, e.g., copper, imagewise exposing the resist to light through the film on the other surface, peeling off the film on the resist surface, and developing the resist. In this process, the resist is frequently contaminated with dust upon adhesion of the dry film, thereby reducing to the yield.
2. In the case of using a liquid resist, on the other hand, it is required that the resist be applied to both surfaces of every sheet of the plate by means of a rotary coating device such as spinner, thereby markedly deteriorating the productivity with an extremely great loss of the liquid resist, and further involving another serious problem of easy sticking of dust.
3. After the degreasing and acid cleaning treatments as described above, a dry type film is adhered or deposited on both surfaces of the plate, and then the laminate is exposed to light with a mask film being placed on both the upper and lower surfaces thereof. If once fine dust is stuck on the dry film to be contacted with the mask film, it is not easy to eliminate the fine dust from the dry film.
4. In the case of using a conventional dry film and liquid resist, the resist which is removed by development with a developer cannot be completely dissolved in the developer, but is partly released in the form of film. In some cases, there is a fear such that the resulting scum may reattach to the material to make it a rejected article.
5. When a lead-frame forming material to which a conventional dry film or liquid resist has been adhered is allowed to stand for more than 3 or 4 days, the adhesion power becomes so strong that incomplete removal of the resist occurs, thereby making it impossible to form accurate patterns.
6. Another problem arises when the etching pattern as described above is exposed to light. More specifically, a pattern formed mask film is placed on a lead-frame forming material on which a light-sensitive layer has been provided, and brought into close contact therewith. The close contact between the mask and the lead-frame forming material can be accomplished by various methods. For example, it can be squeezed by a roller on the mask film. Alternatively, the lead-frame forming material on which a mask film has been placed is set in a frame and then evacuated to remove the air between the mask film and the lead-frame forming material. Thus, it is tried to prevent a printing image from undercutting during exposure. However, in the roller squeezing method, it is hard to remove the air present between the mask film and the forming material. On the other hand, the evacuation method has a disadvantage in that it takes much time to remove the air from the central part because the air removal begins with the circumferential part, in the worst case, the air cannot be removed from the central part.

In addition, the following new problems arise in the course of application of the material of the present invention.

7. The generation of pinholes and microscopic film peeling of the resist occasionally occur in the developing and etching steps.
8. Still another problem is that it is difficult to realize a high resolution required as the market needs lead-frames with more pins and a higher precision.

SUMMARY OF THE INVENTION

The present invention has been worked out to eliminate the above-described disadvantages. Thus, a lead-frame forming material has the following features:

First Embodiment of the Invention

1. A lead-frame forming material which is prepared by coating a light-sensitive material on both surfaces of a metal web made of copper, copper alloy or nickel alloy, drying the coat, and winding it into a roll or cutting off at every fixed length and stacking thereof, wherein the light-sensitive material comprises (1) a diazo salt light-sensitive resin and (2) a water-insoluble but alkaline water-soluble lipophilic high molecular weight compound.
2. A lead-frame forming material as described in item 1 above, wherein protrusions having a height from 0.5 μm to 30 μm are provided on the surface of the light-sensitive layer.
3. A lead-frame forming material as described in item 1 above, wherein fine roughness from 0.05 μm to 1 μm is provided on the surface of the metal web made of copper, copper alloy or nickel alloy.

Second Embodiment of the Invention

4. A lead-frame forming material which is prepared by coating a light-sensitive material on both surfaces of a metal plate made of copper, copper alloy or nickel alloy, drying the coat, and winding it into a roll or cutting off at every fixed length and stacking thereof, wherein the light-sensitive material comprises a photodimeric light-sensitive composition.
5. A lead-frame forming material as described in item 4 above, wherein protrusions having a height from 0.5 μm to 30 μm are provided on the surface of the light-sensitive layer.
6. A lead-frame forming material as described in item 4 above, wherein fine roughness from 0.05 μm to 1 μm is provided on the surface of the metal web made of copper, copper alloy or nickel alloy.

Third Embodiment of the Invention

7. A lead-frame forming material which is prepared by coating a light-sensitive material on both surfaces of a metal plate made of copper, copper alloy or nickel alloy, drying the coat, and winding it into a roll or cutting off at every fixed length and stacking thereof, wherein the light-sensitive material is a negative resist composition which comprises (1) a water-insoluble but alkaline water-soluble resin, (2) a compound capable of generating an acid by irradiation with active rays or radiant rays, and (3) a compound containing at least one crosslinkable group by the action of an acid.
8. A lead-frame forming material as described in item 7 above, wherein protrusions having a height from 0.5 μm to 30 μm are provided on the surface of the light-sensitive layer.
9. A lead-frame forming material as described in item 7 above, wherein fine roughness from 0.05 μm to 1 μm is provided on the surface of the metal web made of copper, copper alloy or nickel alloy.

DETAILED DESCRIPTION OF THE INVENTION

A lead-frame forming material of the present invention is prepared by a process which comprises subjecting a lead-frame forming metal web to degreasing and acid cleaning in sequence, coating a light-sensitive solution composition of the present invention on both surfaces of the treated metal plate web, followed by drying to form a light-sensitive layer, and then cutting the coated lead-frame metal web in fixed lengths or winding it into a roll.

According to the above-described process, the working process can be simplified to a great extent, compared with the process using a conventional dry film or liquid resist. Further, the problem of dust attachment caused by adhesion of a dry film or the excessive loss of a liquid resist caused when it is applied every sheet can be avoided.

The continuous winding operation or the stacking after cutting operation can be accomplished only with the light-sensitive material of the present invention. It can be accomplished by no means with the resist material which constitutes the conventional dry film or liquid resist such as casein, because of its adhesion trouble.

Further, in the case of using a conventional dry film, photopolymerizable light-sensitive materials are used in most cases, because adhesiveness to a substrate, such as a copper plate, and elasticity are required of those light-sensitive materials. Accordingly, development must be of a peeling type. Further, the adhesiveness increases with the lapse of time. Thus, the light-sensitive materials after lamination have a short life time. In contrast, the light-sensitive materials used in the present invention are not photopolymerizable ones but a solution development type, and they show no excessive increase in adhesiveness with the lapse of time because of their less interaction with the substrate.

Formation of protrusions on the coat (light-sensitive layer), as described above, ensures the prevention of adhesion between light-sensitive layers, even if these layers are more or less adhesive, when they are brought into contact with each other by winding the light-sensitive material coated on both surfaces of a metallic substrate, such as copper plate, copper alloy plate, etc., into a roll or by cutting it off at every fixed length into sheets and then stacking each sheet upon another. Further, when a mask film or original is placed on the coat of light-sensitive material and set in a frame, the protrusions on the coat can form a definite narrow gap between the mask film or original and the lead-frame forming material, thereby making it possible to remove the air throughout, from the circumferential part to the central part, in a short period of time.

The height of protrusions on the coat of the light-sensitive layer is within the range of 0.5 to 30 μm, preferably from 1 to 15 μm, and more preferably from 3 to 12 μm.

If the protrusions have a height lower than 0.5 μm, their effect upon adhesion and evacuation is too small no matter how may such protrusions are provided; while if their height is above 30 μm, the exposure via the mask film tends to cause undercutting of a printing image because of too great distance between the mask film and the coat.

Furthermore, even when the light-sensitive material as described above is used, the coat thereof is occasionally poor in adhesiveness to the substrate, which may cause troubles in development, etching or other steps. In this case, it is extremely effective to finely roughen the surface of a metallic substrate made of copper, copper alloy or the like. It is desirable that the fine roughness of the substrate surface be in the range of 0.03 to 1 μm, preferably from 0.06 to 0.8 μm, and more preferably from 0.1 to 0.6 μm.

Methods which can be adopted in forming protrusions on the light-sensitive layer and in forming fine roughness on the surface of a metallic substrate are illustrated hereinafter.

A high resolution can be effectively realized by the combined use of a compound which generates an acid by irradiation with active rays and the like and a compound which is crosslinked by the action of an acid.

The light-sensitive resin in the first embodiment of the present invention will be further described hereinafter.

(1) In the first embodiment of the present invention, the light-sensitive layer comprises a diazo salt light-sensitive resin and a water-insoluble but alkaline-soluble lipophilic high molecular weight compound.

(i) Diazo Resin:

As the diazo resin, there may be used an inorganic salt of organic solvent-soluble diazo resin obtained by the reaction of a condensate of p-diazodiphenylamine and formaldehyde or acetaldehyde with tetrafluorophosphate or tetrofluoroborate, or an organic acid salt of organic solvent-soluble diazo resin obtained by the reaction of the foregoing condensate with a sulfonic acid such as paratoluenesulfonic acid or salt thereof, a phosphinic acid such as benzenephosphinic acid or salt thereof or a hydroxyl-containing compound such as 2,4-dihydroxybenzophenone and 2-hydroxy-4-methoxybenzophenone-5-sulfonic acid or salt thereof, as described in U.S. Pat. No. 3,300,309.

Other examples of diazo resin which can be preferably used in the present invention include a copolyconsensate containing an aromatic compound having at least one organic group selected from carboxyl group, sulfonic group, sulfinic group, oxygen acid group of phosphorus and hydroxyl group and a diazonium compound, preferably an aromatic diazonium compound, as structural units.

Preferred examples of the foregoing aromatic ring include phenyl group and naphthyl group.

Examples of the aromatic compound having at least one selected from carboxyl group, sulfonic group, sulfinic group, oxygen acid group of phosphorus and hydroxyl group include various aromatic compounds. Preferred among these aromatic compounds are 4-methoxybenzoic acid, 3-chlorobenzoic acid, 2,4-dimethoxybenzoic acid, p-phenoxybenzoic acid, 4-anilinobenzoic acid, phenoxyacetic acid, phenylacetic acid, p-hydroxybenzoic acid, 2,4-dihydroxybenzoic acid, benzenesulfonic acid, p-toluenesulfinic acid, 1-naphthalenesulfonic acid, phenylphosphoric acid, and phenylphosphonic acid. As the aromatic diazonium compound constituting the diazo resin as copolycondensate, there may be used a diazonium salt as disclosed in JP-B-49-48001, with diphenylamine-4-diazonium salt being particularly preferred.

A diphenylamine-4-diazonium salt can be derived from 4-amino-diphenylamines. Examples of these 4-amino-diphenylamines include 4-amino-diphenylamine, 4-amino-3-methoxy-diphenylamine, 4-amino-2-methoxy-diphenylamine, 4'-amino-2-methoxy-diphenylamine, 4'-amino-4-methoxy-diphenylamine, 4-amino-3-methyldiphenylamine, 4-amino-3-ethoxy-diphenylamine, 4-amino-3-β-hydroxyethoxydiphenylamine, 4-amino-diphenylamine-2-sulfonic acid, 4-amino-diphenylamine-2-carboxylic acid, and 4-amino-diphenylamine-2'-carboxylic acid. Particularly preferred among these 4-amino-diphenylamines are 3-methoxy-4-amino-4-diphenylamine and 4-amino-diphenylamine.

As a diazo resin other than the diazo resin polycondensed with an aromatic compound having an acid group, there may be preferably used a diazo resin condensed with an aldehyde containing an acid group or its acetal compound as described in JP-A-4-18559, JP-A-3-163551, JP-A-3-253857 (the term "JP-A" as used herein means an "unexamined published Japanese patent application".

Examples of counter anion to be contained in the diazo resin include an anion which forms a stable salt with the diazo resin and renders the diazo resin soluble in an organic solvent. Examples of such an anion include organic carboxylic acid such as decanoic acid and benzoic acid, organic phosphoric acid such as phenylphosphoric acid, and sulfonic acid. Representative examples of such an acid include fluoroalkanesulfonic acid such as methanesulfonic acid and trifluoromethanesulfonic acid, aliphatic or aromatic sulfonic acid such as laurylsulfonic acid, dioctylsulfosuccinic acid, dicyclohexylsulfosuccinic acid, camphorsulfonic acid, tollyloxy-3-propanesulfonic acid, nonylphenoxy-3-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, decylbenzenesulfonic acid, dodecylbenzenesulfonic acid, butoxybenzenesulfonic acid, dodecyloxybenzenesulfonic acid, 2-hydroxy-4-methoxybenzophenone-5-sulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitro-naphthalene-3,6-disulfonic acid and dimethyl-5-sulfoisophthalate, hydroxyl group-containing aromatic compound such as 2,2',4,4'-tetrahydroxybenzophenone, 1,2,3-trihydroxybenzophenone and 2,2',4-trihydroxybenzophenone, halogenated Lewis acid such as hexafluorophosphoric acid and tetrafluoroboric acid, and perhalogenic acid such as $ClO_4$ and $IO_4$. However, the present invention is not limited to these compounds. Particularly preferred among these compounds are butylnaphthalenesulfonic acid, dibutylnaphthalenesulfonic acid, hexafluorophosphoric acid, 2-hydroxy-4-methoxybenzophenone-5-sulfonic acid, and dodecylbenzenesulfonic acid.

The molecular amount of the diazo resin to be used in the present invention can be controlled to an arbitrary value by properly varying the molar ratio of the various monomers and the condensation conditions. In order to make an effective application to the desired use in the present invention, the molecular amount of the diazo resin should be in the range of about 400 to 100,000, preferably about 800 to 8,000.

(ii) Water-Insoluble but Alkaline Water-Soluble Lipophilic High Molecular Weight Compound:

Examples of the water-insoluble but alkaline water-soluble lipophilic high molecular weight compound include a copolymer normally having a molecular amount of 10,000 to 200,000 comprising the following monomers (1) to (15) as structural units.

(1) Acrylamides, methacrylamides, acrylic esters, methacrylic esters and hydroxystyrenes containing aromatic hydroxyl group, such as N-(4-hydroxyphenyl)acrylamide, N-(4-hydroxyphenyl)methacrylamide, o-hydroxystyrene, m-hydroxystyrene, p-hydroxystyrene, o-hydroxyphenyl acrylate, m-hydroxyphenyl acrylate, p-hydroxyphenyl acrylate, o-hydroxyphenyl methacrylate, m-hydroxyphenyl methacrylate, and p-hydroxyphenyl methacrylate;

(2) Acrylic esters and methacrylic esters containing aliphatic hydroxyl group, such as 2-hydroxyethyl acrylate, 2-hydroxyethyl methacrylate, and 4-hydroxybutyl methacrylate;

(3) Unsaturated carboxylic acids such as acrylic acid, methacrylic acid, maleic anhydride and itaconic acid;

(4) (Substituted) alkyl acrylates such as methyl acrylate, ethyl acrylate, propyl acrylate, butyl acrylate, amyl acrylate, hexyl acrylate, cyclohexyl acrylate, octyl acrylate, benzyl acrylate, 2-chloroethyl acrylate, glycidyl acrylate and N-dimethylaminoethyl acrylate;

(5) (Substituted) alkyl methacrylates such as methyl methacrylate, ethyl methacrylate, propyl methacrylate, butyl methacrylate, amyl methacrylate, cyclohexyl methacrylate, benzyl methacrylate, glycidyl methacrylate and N-dimethylamylethyl methacrylate;

(6) Acrylamides or methacrylamides such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(7) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(8) Vinyl esters such as vinyl acetate, vinyl chloroacetate, vinyl butyrate and vinyl benzoate;

(9) Styrenes such as styrene, α-methylstyrene and chloromethylstyrene;

(10) Vinyl ketones such as methyl vinyl ketone, ethyl vinyl ketone, propyl vinyl ketone and phenyl vinyl ketone;

(11) Olefins such as ethylene, propylene, isobutylene, butadiene and isoprene;

(12) Vinylpyrrolidone, N-vinylcarbazole, 4-vinylpyridine, acrylonitrile and methacrylonitrile;

(13) Unsaturated imides such as maleimide, N-acryloylamide, N-acetyl methacrylamide, N-propionyl methacrylamide and N-(p-chlorobenzoyl) methacrylamide;

(14) Unsaturated sulfonamides such as methacrylic amide, e.g., N-(o-aminosulfonylphenyl)methacrylamide, N-(m-aminosulfonylphenyl)methacrylamide, N-(p-amino)sulfonylphenyl methacrylamide, N-(1-(3-aminosulfonyl)naphthyl) methacrylamide, N-(2-aminosulfonylethyl) methacrylamide, acrylamide containing the same substituents as above, and methacrylic ester, e.g., o-aminosulfonylphenyl methacrylate, m-aminosulfonylphenyl methacrylate, p-aminosulfonylphenyl methacrylate, 1-(3-aminosulfonylnaphthyl)methacrylate, and acrylic ester containing the same substituents as above;

(15) Unsaturated monomers having crosslinkable groups in its side chains, such as N-(2-(methacryloyloxy)-ethyl)-2,3-dimethylmaleimide and vinyl cinnamate, which may be copolymerized with monomers copolymerizable with the above-mentioned monomers;

(16) Phenolic resins as disclosed in U.S. Pat. No. 3,751,257 and polyvinyl acetal resins such as polyvinyl formal resin and polyvinyl butyral resin; and

(17) High molecular weight compounds obtained by alkali-solubilizing polyurethane, as disclosed in JP-B-54-19773 (the term "JP-B" as used herein means an "examined Japanese patent publication"), JP-A-57-94747, JP-A-60-182437, JP-A-62-58242, JP-A-62-123452, JP-A-62-123453, JP-A-63-113450, and JP-A-2-146042.

The optimum molecular weight of the foregoing copolymer is in the range of 10,000 to 200,000.

The foregoing copolymer may comprise a polyvinyl butyral resin, polyurethane resin, polyamide resin, epoxy resin, novolak resin, natural resin, etc. incorporated therein as necessary.

The light-sensitive composition of the present invention may further comprise a dye incorporated therein for the purpose of providing a visible image upon exposure to light and a visible image after development.

Examples of such a dye include a triphenylmethane, diphenylmethane, oxazine, xanthene, iminonaphthoquinone, azomethine or anthraquinone dye which changes its color to colorless or a different color, such as Victoria Pure Blue BOH (available from Hodogaya Chemical Co., Ltd.), Oil Blue #603 (available from Orient Chemical Industries, Ltd.), Patent Pure Blue (available from Sumitomo Mitsukuni Chemical Co., Ltd.), Crystal Violet, Brilliant Green, Ethyl Violet, Methyl Violet, Methyl Green, Erythrosine B Basic Fuchsine, Malachite Green, Oil Red, m-Cresol Purple, Rhodamine B, Auramine, 4-p-diethylaminophenyliminaphtho-quinone and cyano-p-diethylaminophenylacetanilide.

On the other hand, as a colorable dye which changes from colorless to a color, there may be used a leuco dye or a primary or secondary arylamine dye such as triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p',p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane and p,p',p"-triaminotriphenylmethane. Particularly useful among these dyes are triphenylmethane dye and diphenylmethane dye, preferably triphenylmethane dye. In particular, Victoria Pure Blue BOH is preferred.

The light-sensitive composition of the present invention may further comprise various additives incorporated therein. Examples of additives which can be preferably used in the present invention include alkyl ethers for improving the coating properties of the light-sensitive composition (e.g., ethyl cellulose, methyl cellulose), fluorinic surface active agents and nonionic surface active agents (particularly fluorinic surface active agents), plasticizers for rendering the coating flexible and abrasion resistant (e.g., butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, acrylic or methacrylic oligomer or polymer; particularly preferred among these compounds is tricresyl phosphate), stabilizers (e.g., phosphoric acid, phosphorous acid, organic acid (e.g., citric acid, oxalic acid, dipicric acid, benzenesulfonic acid, naphthalenesulfonic acid, sulfosalicylic acid, 4-methoxy-2-hydroxybenzophenone-5-sulfonic acid, tartaric acid)), and development accelerators (e.g., higher alcohol, acid anhydride).

In order to provide the foregoing light-sensitive composition on the metallic substrate, a method may be employed which comprises dissolving a light-sensitive diazo resin, a lipophilic high molecular weight compound, and optionally various additives in a proper solvent (e.g., methyl cellosolve, ethyl cellosolve, dimethoxy ethane, diethyl glycol monomethyl ether, diethylene glycol dimethyl ether, 1-methoxy-2-propanol, methyl cellosolve acetate, acetone, methyl ethyl ketone, methanol, dimethyl formamide, dimethyl acetamide, cyclohexanone, dioxane, tetrahydrofuran, methyl lactate, ethyl lactate, ethylene dichloride, dimethyl sulfoxide, water, a mixture thereof) in a predetermined amount to prepare a coating solution of the light-sensitive composition, applying the coating solution to both surfaces of the metallic substrate, and then drying the coating.

As the solvent, there may be used a single solvent. A mixture of a high boiling point solvent such as methyl cellosolve, 1-methoxy-2-propanol and methyl lactate and a low boiling point solvent such as methanol and methyl ethyl ketone is preferred.

The solid content in the light-sensitive composition to be applied is preferably in the range of 1 to 50% by weight.

In this case, the coated amount of the light-sensitive composition may be in the range of about 0.2 to 100 g/m$^2$ (dry weight), preferably 0.5 to 20 g/m$^2$.

The components (i) and (ii) exert the following effects when the lead-frame forming material comprising the foregoing light-sensitive composition of the present invention is used to form a lead frame.

The component (i) is a light-sensitive substance which undergoes development taking advantage of a phenomenon in which a water-soluble resin is rendered water-insoluble to form an image. However, since the component (i) is relatively low molecular, the resulting film is so weak that it can be easily damaged during the various steps and exhibits a weak adhesiveness to a substrate made of copper or the like. The mixing of the resin (ii) adds to the fastness of the image. However, the unexposed area must be dissolved away with the developer after the alkali development. Therefore, one of the requirements of the component (i) is that it is alkali-soluble. Further, the component (i) also needs to be lipophilic to enhance its adhesion to a substrate made of copper or the like.

The second embodiment of the present invention will be further described hereinafter.

(2) The light-sensitive composition to be used in the second embodiment of the present invention is a photodimeric light-sensitive composition.

The photodimeric light-sensitive composition is a resin which acts as both a light-sensitive substance and a binder itself. One of its main features is that it provides a high film strength and can hardly be damaged as compared with the light-sensitive composition as the first embodiment of the present invention. Further, since the photodimeric light-sensitive composition doesn't suffer from any reaction lag due to oxygen as encountered in the addition polymerization type composition, the light-sensitive layer doesn't need to have any oxygen shield layer provided thereon.

As such a photodimeric light-sensitive composition, there may be used a polymer having maleimide group, cinnamyl group, cinnamoyl group, cinnamylidene group, cinnamylideneacetyl group or chalcone group in its side chain or main chain. Examples of the polymer containing maleimide group in its side chain include polymers as disclosed in JP-A-52-988 (corresponding to U.S. Pat. No. 4,079,041), German Patent 2,626,769, European Patents 21,019 and 3,552, "Die Angewandte Makromolekulare Chemie", 115, (1983), pp. 163–181, JP-A-49-128991, JP-A-49-128992, JP-A-49-128993, JP-A-50-5376, JP-A-50-5377, JP-A-50-5378, JP-A-50-5379, JP-A-50-5380, JP-A-53-5298, JP-A-53-5299, JP-A-53-5300, JP-A-50-50107, JP-A-51-47940, JP-A-52-13907, JP-A-50-45076, JP-A-52-121700, JP-A-50-10884, and JP-A-50-45087, German Patents 2,349,948 and 2,616,272.

In order to render such a polymer soluble in or swellable with aqueous alkali, a carboxylic acid, sulfonic acid, phosphoric acid, phosphonic acid, alkaline metal salt or ammonium salt thereof, aqueous alkali-dissociative acid group having pKa of 6 to 12, etc. may be effectively incorporated in the polymer. If necessary, one to three monomers having such an acid group and a monomer having maleimide group may be copolymerized.

The acid value of the maleimide polymer having an acid group is preferably in the range of 30 to 300. Useful among these polymer having such an acid value is a copolymer of N-[2-(methacryloyloxy)ethyl]-2,3-dimethylmaleimide with methacrylic acid or acrylic acid as disclosed in "Die Angewandte Makromolekulare Chemie", 128, (1984), pp. 71–91. In the synthesis of such a copolymer, a vinyl monomer as a third component may be used for copolymerization to provide easy synthesis of a multiple copolymer depending on the purpose. For example, an alkyl methacrylate or alkyl acrylate which exhibits a glass transition point of not higher than room temperature in the form of homopolymer may be used as the vinyl monomer to render the copolymer flexible.

Examples of the photo-crosslinkable polymer having cinnamyl group, cinnamoyl group, cinnamylidene group, cinnamylideneacetyl group, chalcone group, etc. in its side chain or main chain include light-sensitive polyesters as disclosed in U.S. Pat. Nos. 3,030,208, 709,496, and 828,455.

Examples of polymers obtained by rendering these photocrosslinkable polymers soluble in aqueous alkali include light-sensitive polymers as disclosed in JP-A-60-191244.

Further examples of such polymers include light-sensitive polymers as disclosed in JP-A-62-175729, JP-A-62-175730, JP-A-63-25443, JP-A-63-218944, and JP-A-63-218945.

The light-sensitive layer comprising the foregoing components may further comprise a sensitizer incorporated therein. Examples of such a sensitizer include benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, naphthofuranone compounds, pyrylium salts, and thiapyrylium salts. If necessary, such a light-sensitive layer may comprise a binder such as copolymer of at least one of monomers (e.g., chlorinated polyethylene, chlorinated polypropylene, polyacrylic alkylester, acrylic alkylester, acrylonitrile, vinyl chloride, styrene, butadiene), polyamide, methyl cellulose, polyvinyl formal, polyvinyl butyral, methacryl acid copolymer, acrylic acid copolymer, itaconic acid copolymer, or a plasticizer such as dialkyl ester phthalate, e.g., dibutyl phthalate, dihexyl phthalate, oligoethylene glycol alkyl ester and phosphoric ester incorporated therein. For the purpose of coloring the light-sensitive layer, the light-sensitive layer may preferably comprise a dye, a pigment or a pH indicator as printing-out agent incorporated therein. The solid content in the light-sensitive composition to be applied is preferably in the range of 1 to 50% by weight.

In this case, the coated amount of the light-sensitive composition may be in the range of about 0.2 to 100 g/m$^2$ (dry weight), preferably 0.5 to 20 g/m$^2$, more preferably 0.8 to 10 g/m$^2$.

The third embodiment of the present invention will be further described hereinafter.

(3) The light-sensitive composition to be used in the third embodiment of the present invention has the following components:
  (i) a water-insoluble but alkaline water-soluble resin;
  (ii) a compound which generates an acid by irradiation with active rays or radiant rays; and
  (iii) a compound having at least one crosslinkable group by the action of an acid.

The foregoing components of the light-sensitive composition of the present invention will be further described hereinafter.

(i) Component (a): Alkali-Soluble Resin

The water-insoluble but alkaline water-soluble resin as the component (a) is preferably a polymer having an acidic hydrogen atom with pKa of not more than 11, such as phenolic hydroxyl group, carboxylic group, sulfonic group, imide group, sulfonamide group, N-sulfonylamide group, N-sulfonylurethane group and active methylene group. Preferred examples of alkali-soluble polymer include novolak phenol resin such as phenol formaldehyde resin, o-cresol formaldehyde resin, m-cresol formaldehyde resin, p-cresol formaldehyde resin, xylenol formaldehyde resin and copoly-condensate thereof. As described in JP-A-50-125806, the foregoing phenolic resin may be used in combination with a condensate of a phenol substituted by a $C_{3-8}$ alkyl group with cresol or formaldehyde, such as t-butylphenol formaldehyde. Further, polymers comprising a phenolic hydroxy-containing monomer as a copolymerizable component such as N-(4-hydroxyphenyl) methacrylamide, homopolymers or copolymers such as p-hydroxystyrene, o-hydroxystyrene, m-isopropenylphenol and p-isopropenylphenol, or polymer obtained by partially etherifying or esterifying these polymers may be used.

Further, polymers comprising as copolymerizable components a carboxyl group-containing monomer such as acrylic acid and methacrylic acid, carboxyl group-containing polyvinyl acetal resins as described in JP-A-61-267042, and carboxyl group-containing polyurethane resins as disclosed in JP-A-63-124047 may be preferably used.

Moreover, polymers comprising N-(4-sulfamoylphenyl) methacrylamide, N-phenylsulfonyl methacrylamide and maleimide as copolymerizable components and methylene group-containing monomers as described in JP-A-63-127237 may be used.

Particularly preferred among these resins are m-cresol, p-cresol, o-cresol, and copolymer novolak resin comprising one or more of xylenols such as 2,5-xylenol and 3,5-xylenol.

Referring to the method for the preparation of such a resin, m/p-cresol novolak resin, for example, can be prepared from m-cresol and p-cresol as monomers. In some detail, these monomers are subjected to substantial co-condensation with formaldehyde. Referring to the proportion of the two components, the content of m-cresol in the polymer is in the range of not less than 20%, preferably not less than 40%, more preferably from 60% to 95%.

The preparation of such a novolak resin can be accomplished by various methods. For example, a method may be employed which comprises mixing m-cresol and p-cresol in a predetermined ratio, adding an aqueous solution of formalin to the mixture, and then subjecting the mixture to condensation with triethylamine in the presence of a proper amount of a catalyst.

Alternatively, the novolak resin can be prepared by a process which comprises dissolving monomers and paraformaldehyde in a non-polar solvent such as toluene, and then heating the solution to a high temperature under pressure.

The reaction of the mixture of m-cresol and p-cresol may be effected in the presence of a salt of divalent metal disclosed in the examples of JP-A-59-162542 and JP-A-60-159846 as a reaction catalyst.

All these preparation processes correspond to the synthesis of hyorthonovolak resin. Therefore, the method for the preparation of novolak resin is not limited to the foregoing methods. Any of methods for the synthesis of hyorthonovolak resin can be employed as a desirable method.

The novolak resin thus obtained preferably exhibits a weight average molecular weight of from 1,000 to 30,000 in polystyrene equivalent as determined by gel permeation chromatography (GPC). If the weight average molecular weight of the novolak resin falls below 1,000, the unexposed area shows a great drop in the thickness of the film after development. If it exceeds 30,000, the resulting sensitivity is remarkably low. A particularly preferred range of the weight average molecular weight of the novolak resin is from 2,000 to 15,000.

The distribution of the molecular weight of the novolak resin of the present invention can be properly adjusted by fractionating resins obtained by the condensation reaction. In particular, a novolak resin the dimer content of which has been adjusted to less than 15% by weight by removing low molecular components such as dimer can be used to improve the developability and heat resistance of the light-sensitive composition.

As the method for adjusting the dimer content, there may be used a method which comprises dissolving a novolak resin which has been synthesized according to an ordinary method in a polar solvent such as methanol, ethanol, acetone, methyl ethyl ketone, dioxane and tetrahydrofuran, and then adding the solution to water or a mixture of water and a polar solvent to precipitate the resinous components.

Another method for adjusting the dimer content comprises distilling off the dimer components at a temperature of not lower than 230° C., preferably not lower than 250° C., under a reduced pressure of not more than 10 mmHg, as opposed to the ordinary method for the synthesis of an alkali-soluble resin which comprises distilling off at a temperature of 150° C. to 200° C. under reduced pressure to remove water, unreacted monomers, formaldehyde, etc. This method allows an efficient removal of dimer components.

The foregoing alkali-soluble resins may be used singly. Alternatively, a mixture of several kinds of these alkali-soluble resins may be used.

The composition of the present invention comprises these alkali-soluble resins in a concentration necessary for the film formation, i.e., not less than 40% by weight, preferably from 60 to 95% by weight, more preferably from 70 to 90% by weight of the total solid content.

(ii) Component (b): Compound which Generates an Acid by irradiation with Active Rays or Radiant Rays (Radiation)

As the foregoing compound which generates an acid upon irradiation with active light or radiation, there may be properly selected from photoinitiator of photo cationic polymerization, photoinitiator of photo radical polymerization, dye photodecolorizer, dye photodiscolorizer, known compound for use in microresist, etc. which generates an acid upon irradiation with light, and mixture thereof.

Examples of these compounds include onium salts such as diazonium salts as disclosed in S. I. Schkesinger, "Photogr. Sci. Eng.", 18, 387 (1974), and T. S. Bal et al., "Polymer", 21, 423 (1980), ammonium salts as disclosed in U.S. Pat. Nos. 4,069,055, 4,069,056, Re. 27,992 and JP-A-3-140140, phosphonium salts as disclosed in D. C. Necker et al., "Macromoleculaes", 17, 2468 (1984), C. S. Wen et al., "Teh. Proc. Conf. Rad. Curing", ASIA, page 478, Tokyo, Oct (1988), U.S. Pat. Nos. 4,069,055 and 4,069,056, iodonium salts as disclosed in J. V. Crivello et al., "Macromorecules", 10 (6), 1307 (1977), Chem. & Eng. New, Nov. 28, page 31 (1988), EP-B-104,143, JP-A-2-150848, and JP-A-2-296514, sulfonium salts as disclosed in J. V. Crivello et al., "Polymer J.", 17, 73 (1985), J. V. Crivello et al., "J. Org. Chem.", 43, 3055 (1978), W. R. Watt et al., "J. Polymer Sci.", Polymer Chem. Ed., 22, 1789 (1984), J. V. Crivello et al., "Polymer Bull.", 14, 279 (1985), J. V. Crivello et al., "Macromorecules", 14 (5), 1141 (1981), J. V. Crivello et al., "Polymer Sci.", Polymer Chem. Ed., 17, 2877 (1979), EP-B-370,693, U.S. Pat. No. 3,902,114, EP-B-233,567, EP-B-297,443, EP-B-297,442, U.S. Pat. Nos. 4,933,377, 4,760,013, 4,734,444, and 2,833,827, German Patents 2,904, 626, 3,604,580, and 3,604,581, selenonium salts as disclosed in J. V. Crivello et al., "Macromorecules", 10 (6), 1307 (1977), J. V. Crivello et al., "Polymer Sci.", Polymer Chem. Ed., 17, 1047 (1979), and arsonium salts as disclosed in C. S. Wen et al., "Teh, Proc. Conf. Rad. Curing", ASIA, page 478, Tokyo, Oct (1988), organic halogen compounds as disclosed in U.S. Pat. No. 3,905,815, JP-B-46-4605 (The term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339, organic metal/organic halogen compounds as disclosed in K. Meier et al., "J. Rad. Curing", 13 (4), 26 (1986), T. P. Gill et al., "Inorg. Chem.", 19, 3007 (1980), D. Astruc, "Acc. Chem. Res.", 19 (12), 377 (1896), and JP-A-2-161445, photo acid generators containing o-nitrobenzyl type protective group as disclosed in S. Hayase et al., "Jo Polymer Sci.", 25, 753 (1987), E. Reichmanis et al., "J. Polymer Sci.", Polymer Chem. Ed., 23, 1 (1985), Q. Q. Zhu et al., "J. Photochem.", 36, 85, 39, 317 (1987), B. Amit et al., "Tetrahedron Lett.", (24) 2205 (1973), D. H. R. Barton et al., "J. Chem. Soc.", 3571 (1965), 3571 (1965), P. M. Collins et al., "J. Chem. Soc.", Perkin I, 1695 (1975), M. Rudinstein et al., "Tetrahedron Lett.", (17), 1445 (1975), J. W. Walker et al., "J. Am. Chem. Soc.", 110, 7170 (1988), S. C. Busman et al., "J. Imaging Technol.", 11 (4), 191 (1985), H. M. Houlihan et al., "Macromolecules", 21, 2001 (1988), P. M. Collins et al., "J. Chem. Soc.", Chem. Commun., 532 (1972), S. Hayase et al., "Macromolecules", 18, 1799 (1985), E. Reichmanis et al., "J. Electrochem. Soc.", Solid State Sci. Technol., 130 (6), F. M. Houlihan et al., "Macromolecules", 21, 2001 (1988), EP-B-0290,750, EP-B-046,083, EP-B-156,535, EP-B-271,851, EP 0,388,343, U.S. Pat. Nos. 3,901,710, and 4,181,531, JP-A-60-198538, and JP-A-53-133022, compounds which undergo photodecomposition to generate a sulfonic acid, such as imino sulfonate, as disclosed in M. Tunooka et al., "Polymer Preprints", Japan, 35 (8), G. Berner et al., "J. Rad. Curing", 13 (4), W. J. Mijs et al., "Coating Technol.", 55 (697), 45 (1983), Akzo, H, Adachi et al., "Polymer Preprints", Japan, 37 (3), EP-B-0,199,672, EP-B-84,515, EP-B-044,115, EP-B-0,101,122, U.S. Pat. Nos. 4,371,605, and 4,431,774, JP-A-64-18143, JP-A-2-245756, and JP-A-3-140109, and disulfone compounds as disclosed in JP-A-61-166544.

Further, compounds having in its main chain or side chain the foregoing group or compound which generates an acid upon irradiation with light may be used. Examples of such compounds include those described in M. E. Woodhouse et al., "J. Am. Chem. Soc.", 104, 5586 (1982), S. P. Pappas et al., "J. Imaging Sci.", 30 (5), 218 (1986), S. Kondo et al., "Makromol. Chem.", Rapid Commun., 9, 625 (1988), Y. Yamada et al., "Makromol. Chem.", 152, 153, 163 (1972), J. V. Crivello et al., "J. Polymer Sci.", Polymer Chem. Ed., 17, 3845 (1979), U.S. Pat. No. 3,849,137, German Patent 3,914, 407, JP-A-63-26653, JP-A-55-164824, JP-A-62-69263, JP-A-63-146038, JP-A-63-163452, JP-A-62-153853, and JP-A-63-146029.

Further, compounds which generate an acid upon irradiation with light as disclosed in V. N. R. Pillai, "Synthesis", (I), 1 (1980), A. Abad et al., "Tetrahedron Lett.", (47) 4555 (1971), D. H. R. Barton et al., "J. Chem. Soc.", (C), 329 (1970), U.S. Pat. No. 3,779,778, and EP-B-126,712 may be used.

(iii) Component (c): Acid-Setting Compound

Examples of the acid-setting compound of the present invention include a compound which undergoes crosslinking or polymerization reaction in the presence of an acid catalyst, optionally under heating, to reduce the solubility of a novolak resin in an alkali. A typical example of such a compound is one having a formaldehyde precursor a methylol group or a substituted methylol group, represented by the following structural formula:

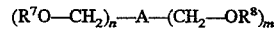

In the foregoing structural formula, A represents a group represented by B or B-Y-B in which B represents a substituted or unsubstituted single or condensed polynuclear aromatic hydrocarbon group or heterocyclic compound containing oxygen, sulfur and nitrogen and Y represents a single bond, $C_{1-4}$ alkylene, substituted alkylene, arylene, substituted arylene, arylalkylene, —O— bond, —S— bond, —$SO_2$— bond, —CO— bond, —COO— bond, —OCOO— bond, —CONH— bond or substituted or unsubstituted alkylene group partly having these bonds. Y may be a polymer such as phenolic resin.

$R^7$ and $R^8$ may be the same or different and each represent a hydrogen atom or $C_{1-4}$ alkyl, cycloalkyl, substituted or unsubstituted aryl, alkaryl, arylalkyl or acyl group. The suffix n represents an integer 1 to 3. The suffix m represents an integer 0 to 3.

Specific examples of such a compound include various aminoblasts and phenoblasts, e.g., urea-formaldehyde resin, melamine-formaldehyde resin, benzoguanamine-formaldehyde resin, glycoluryl-formaldehyde resin, monomers or oligomers thereof. These compounds are commercially available from many manufacturers as coating vehicles or the like. Typical examples of these commercial products include Cymel (trade name) 300, 301, 303, 350, 370, 380, 1116, 1130, 1123, 1125, 1170 (available from American Cyanamid), and Nikalac (trade name) Mw30, Mx45, Bx4000 (available from Sanwa Chemical). These compounds may be used singly or in combination.

Other specific examples of such a compound include methylolated or alkoxymethylated phenol derivatives which can be converted to formaldehyde precursors. These phenol derivatives may be used as monomers or in resinified form such as resol resin and benzyl ether resin.

Other examples of the acid-setting compound employable in the present invention include compounds containing silanol group as disclosed in JP-A-2-154266 and JP-A-2-173647.

In the composition of the present invention, the proportion of the acid-setting compound is contained in a proportion of 1 to 60% by weight, preferably 3 to 40% by weight, more preferably 10 to 30% by weight of the total solid content.

(iv) Other Desirable Components:

The negative light-sensitive composition of the present invention may further comprise a dye, a pigment, a plasticizer or a compound for enhancing the efficiency of photodecomposition (so-called sensitizer) incorporated therein as necessary.

Examples of such a sensitizer include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenylstyrylketone, p-(dimethylamino)phenyl-p-methylstyrylketone, benzophenone, p-(dimethylamino)benzophenone, p-(diethylamino) benzophenone, and benzanthrone. Particularly preferred among these sensitizers is p-(dimethylamino)benzophenone.

The composition of the present invention may comprise a cyclic acid anhydride for further enhancing sensitivity, a printing-out agent for providing a visible image shortly after exposure to light and other fillers incorporated therein. Examples of such a cyclic acid anhydride include phthalic anhydride, tetrahydrophthalic anhydride, hexahydrophthalic anhydride, 3,6-endoxy-$\Delta^4$-tetrahydrophthalic anhydride, tetrachtorophthalic anhydride, maleic anhydride, chloromaleic anhydride, α-phenylmaleic anhydride, succinic anhydride, and pyromellitic acid. Such a cyclic acid anhydride can be contained in a proportion of 1 to 15% by weight of the solid content in the total composition to enhance the sensitivity by a factor of about 3. A typical example of the printing-out agent for providing a visible image shortly after exposure to light is a combination of a light-sensitive compound which releases an acid upon exposure to light and a salt-forming organic dye. Specific examples of such a combination include a combination of o-naphthoquinonediazide-4-sulfonic acid halogenide and a salt-forming organic dye as disclosed in JP-A-50-36209 and JP-A-53-8128, and a combination of a trihalomethyl compound and a salt-forming organic dye as disclosed in JP-A-53-36223 and JP-A-54-74728.

In the case where the negative light-sensitive composition of the present invention is used as resistor material for lead-frame, etc., it is used in the form of solution in a solvent. Examples of the solvent employable herein include ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethyl acetamide, N,N-dimethylformamide, tetramethylurea, N-methylpyrrolidone, dimethyl sulfoxide, sulfolane, γ-butyrolactone, toluene, and ethyl acetate. These solvents may be used singly or in admixture. The concentration of the foregoing components (iv) (total solid content, inclusive of additives) is in the range of 2 to 50% by weight. The solid content of the light-sensitive composition to be applied is preferably in the range of 1 to 50% by weight.

In this case, the coated amount of the light-sensitive composition is in the range of from about 0.2 to 100 g/m$^2$ (dry weight), preferably from 0.5 to 20 g/m$^2$, more preferably from 0.8 to 10 g/m$^2$.

In the first, second, and third embodiments of the present invention, there are preferably provided protrusions on the surface of the light-sensitive layer. The provision of protrusions on the surface of the light-sensitive layer can be accomplished by various methods. For example, a method may be employed which comprises dispersing a proper fine particle powder in a solution containing a proper resin, polymer or the like, and then applying the dispersion on the light-sensitive layer.

Preferred examples of the fine particle include polyethylene particle, polypropylene particle, ethylene-propylene copolymer particle, and crosslinked vinyl polymer particle. The crosslinked vinyl polymer particle can be obtained by a well known suspension polymerization method. By way of example, a method may be employed which comprises adding a hydrophobic vinyl monomer containing one vinyl group (e.g., acrylic esters, methacrylic esters, styrene, styrene derivatives, acrylonitriles) and a multifunctional monomer (e.g., divinylbenzene, polyethylene glycol diacrylate (number of ethylenes=1 to 14), polyethylene glycol dimethacrylate (number of ethylenes=1 to 14), trimethylolpropane triacrylate, trimethylolpropane trimethacrylate, pentaerythritol triacrylate, pentaerythritol trimethacrylate, pentaerythritol tetramethacrylate) in an amount of 1 to 30 parts by weight based on the weight of the monomer to an aqueous medium comprising a dispersant commonly used for suspension polymerization (e.g., inorganic powder such as zinc oxide, calcium carbonate and talc, water-soluble high molecular weight compound such as gelatin and polyvinyl alcohol) dissolved therein, evacuating and replacing the atmosphere with nitrogen, adding to the reaction system an ordinary oil-soluble polymerization initiator (e.g., benzoyl peroxide, azobis(isobutylnitrile)) with stirring while the temperature of the reaction system was being kept to about 50° to 80° C. where it was allowed to undergo polymerization reaction for about 2 to 20 hours to obtain a dispersion of crosslinked vinyl polymer, separating the solid matter from the liquid, and then drying the solid matter to obtain a desired crosslinked vinyl polymer particle.

As the liquid for dispersing the fine particle substance therein, there may be used various high molecular weight compounds. Preferred among these high molecular weight compounds are those containing groups such as hydroxy, amino, carboxylic acid, amide, sulfonamide, active methylene thioalcohol and epoxy. Preferred examples of such a binder include shellac as disclosed in U.K. Patent 1,350,521, polymers containing hydroxyethyl acrylate unit or hydroxyethyl methacrylate unit as a main repeating unit as disclosed in U.K. Patent 1,460,978 and U.S. Pat. No. 4,123,276, polyamide resins as disclosed in U.S. Pat. No. 3,751,257, linear polyurethane resins as disclosed in U.S. Pat. No. 3,660,097, epoxy resins obtained by the condensation of bisphenol A with epichlorohydrin, polymers containing amino group such as polyaminostyrene and polyalkylamino (meth)acrylate, and celluloses such as cellulose acetate, cellulose alkyl ether and cellulose acetate phthalate. The solvent to be used herein can be selected from various solvents such as 2-methoxyethanol, 2-ethoxyethanol, 2-methoxyethyl acetate, 2-ethoxyethyl acetate, dimethylformamide, methanol-ethylene dichloride and mixture thereof. In the foregoing methanol-ethylene dioxide mixture, methanol may be replaced by ethanol, n-propanol, isopropanol or mixture thereof, and ethylene dioxide can be replaced by methylene chloride, trichloroethane, monochlorobenzene or mixture thereof. Further, these solvents may be additionally mixed with other solvents as long as it causes no troubles. Examples of such additional solvents include ketones such as acetone, methyl ethyl ketone and methyl isobutyl ketone, esters such as methyl acetate, ethyl acetate, n-propyl acetate, isopropyl acetate, n-butyl acetate and methylamyl acetate, and water. The concentration of the resin solution for dispersing the fine particle substance dissolved in such a solvent is normally in the range of about 0.1 to 30% by weight, preferably 1 to 10% by weight. However, the method for providing protrusions having a height of from 0.5 to 30 μm on the surface of the light-sensitive layer is not limited to the foregoing method.

In the first, second, and third embodiments of the present invention, microscopic unevenness is preferably provided on the surface of the metallic substrate.

As mentioned above, the surface of the metal plate made of copper, copper alloy or the like can be advantageously subjected to fine roughening (providing fine roughness) to enhance the adhesiveness of the light-sensitive composition to the substrate in the first, second, and third embodiments of the present invention. The fine toughening can be accomplished by various methods. Mechanical methods are useful. Specific examples of such mechanical methods include a ball graining method, a blast graining method, and a brush rubbing method by means of a nylon brush with a water-dispersed slurry of an abrasive such as pumice. Such a treatment causes the generation of smut. Such a residue needs to be removed. This smut can be removed with phosphoric acid, nitric acid, sulfuric acid, chromic acid or a mixture thereof.

In the case where the third embodiment of the present invention is used, the components (i), (ii) and (iii) act as follows:

The resin (i) causes the light-sensitive substance to be uniformly dispersed in the light-sensitive layer to compensate for the lack of the film strength that would otherwise occur. Since the unexposed part needs to be dissolved away with an alkaline developer, the resin needs to be alkali-soluble.

Upon irradiation with active light or radiant rays, the compound (ii) generates an acid by which the compound (iii) is then crosslinked to gain a molecular weight high enough to become insoluble in the alkaline developer. In other words, the part which has been irradiated with active light undergoes curing reaction to become insoluble in the developer while the unexposed part is dissolved away during development to form a negative image.

The present invention will be illustrated in more detail by reference to the following non-limiting examples. Unless otherwise indicated, all ratios, percents, etc. are by weight.

EXAMPLE 1

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, then wound into a roll in a length of 2,000 m.

| Light-sensitive Solution Composition | |
|---|---|
| 2-Hydroxyethyl methacrylate copolymer | 0.87 g |
| Salt of a mixture of p-diazodiphenylamine and paraformaldehyde with 2-methoxy-4-hydroxy-5-benzoylbenzensulfonic acid | 0.1 g |
| Oil Blue #603 (trade name) | 0.03 g |
| Methanol | 6 g |
| 2-Methoxyethanol | 6 g |

The thus wound roll was cut off at every length of 500 mm, and 1,000 sheets of Samples $A_1$ to $A_{1000}$ were prepared.

Each of these samples $A_1$ to $A_{1000}$ was used as the lead-frame forming material plate. An etching pattern image forming film original plate was brought into contact with the light-sensitive layer of each sample, and the light-sensitive layer was exposed to light and developed to remove the unexposed part thereof. Thereafter, the lead-frame forming material plate was dipped in an etching solution of ferric chloride, and the etched part was removed therefrom. Thus, 1,000 sheets of a desired lead-frame were prepared.

COMPARATIVE EXAMPLE 1

The light-sensitive solution described below was prepared, and coated on a 25 μm-thick polyethylene terephthalate film base by means of a rod coater, followed by 5 minutes drying in a 100° C. oven making light-sensitive film. The dry thickness of the light-sensitive layer was about 50 μm.

| Light-sensitive Solution Composition | |
|---|---|
| Methyl methacrylate | 40.5 g |
| Methacrylic acid | 4.5 g |
| 2,4-Dimethylthioxanthone | 0.3 g |
| Ethyl p-dimethylaminobenzoate | 0.33 g |
| Tribromomethyl phenylsulfone | 0.4 g |
| Trimethylolpropane triacrylate | 3.0 g |
| Trimethylolpropane diacrylate | 5.0 g |
| Tetraethyleneglycol diacrylate | 2.0 g |
| Leucomethyl Violet | 0.08 g |
| 1-Phenyl-3-morpholinomethyl-1,3,4-triazole-2-thione | 0.09 g |
| Victoria Pure Blue BOH | 0.01 g |
| Methyl cellosolve | 10 g |

The same copper alloy web as used in Example 1 was subjected to the same degreasing and subsequent washing treatments as in Example 1, and covered on both surfaces with the foregoing light-sensitive film by means of a laminator, Model A24 (made by DuPont) at 120° C. so the light-sensitive layer came into contact with the copper surface. The resulting laminate was cut off at every length of 500 mm, and thereby were prepared 1,000 sheets of $B_1$ to $B_{1000}$.

Then, an etching pattern image forming film original plate was brought into contact with each sample, and the light-sensitive layer was exposed to light and developed to remove the unexposed part thereof. Thereafter, the lead-frame forming metal plate was dipped in an etching solution of ferric chloride, and the etched part was removed therefrom. Thus, 1,000 sheets of a desired lead-frame were prepared.

The comparison between Samples $A_1$ to $A_{1000}$ prepared in Example 1 and Samples $B_1$ to $B_{1000}$ prepared in Comparative Example 1 showed that only four sheets of rejected articles were found among Samples $A_1$ to $A_{1000}$, while 83 sheets of rejected articles were found among Samples $B_1$ to $B_{1000}$, the rejected articles of which were itemized as follows.

35 sheets: dust attached during lamination
23 sheets: dust attached during exposure
18 sheets: resist reattached after peeled off during development
7 sheets: other reasons In addition, the time required to prepare Samples $A_1$ to $A_{1000}$ was 2 hours, while the time required to prepare Samples $B_1$ to $B_{1000}$ was 17 hours.

EXAMPLE 2

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, and further coated with a coating solution containing a fine particle material (an overcoat solution) and dried, then wound into a roll in a length of 2,000 m.

| Light-sensitive Solution Composition | |
|---|---|
| 2-Hydroxyethyl methacrylate copolymer | 1.05 g |
| Salt of a mixture of p-diazodiphenylamine and paraformaldehyde with 2-methoxy-4- | 0.1 g |

-continued

| | |
|---|---|
| hydroxy-5-benzoylbenzensulfonic acid | |
| Oil Blue #603 (trade name) | 0.03 g |
| Methanol | 6 g |
| 2-Methoxyethanol | 6 g |
| Overcoat Solution Composition | |
| 2-Hydroxyethyl methacrylate copolymer | 0.3 g |
| Urea-formaldehyde resin (average particle size: 5 μm) | 0.025 g |
| Methanol | 6 g |
| 2-Methoxyethanol | 6 g |

The coverage of the coating solution was 4 g/m$^2$ and that of the overcoat solution was 0.3 g/m$^2$.

The foregoing wound roll was stored for 20 days in a room regulated at a temperature of 40°–45° C. and a humidity of 60–70%, and then cut at every length of 500 mm to prepare 3,900 sheets of plates. All of these plates were free from adhesion troubles on both surfaces.

An etching pattern image forming film original plate was plated on one of the lead-frame forming plates obtained above, and evacuated to bring them into contact with each other.

This operation was repeated five times using 5 sheets of plates separately. As shown in Table 1, the contact operation was completed throughout the plate in 25.6 seconds on average, and the image formed on these plates were not undercut by exposure.

TABLE 1

| Plate No. | Time required for complete contact |
|---|---|
| 1 | 25 sec. |
| 2 | 27 sec. |
| 3 | 23 sec. |
| 4 | 29 sec. |
| 5 | 24 sec. |
| on average | 25.6 sec. |

COMPARATIVE EXAMPLE 2

A light-sensitive material having the following composition was coated on the same copper alloy web as in Example 1 at a dry coverage of 5 g/m$^2$, and dried, then the coated web was wound into a roll. After winding it into a roll in a length of 50 m, the roll was immediately unwound. As a result, adhesion mark was observed over at least 80% of the whole area.

| Light-sensitive Solution Composition | |
|---|---|
| Methyl methacrylate/methacrylic acid/2-ethylhexyl acrylate/benzyl methacrylate copolymer (molar ratio: 55/28/12/5; weight average molecular weight: 80,000; 35 wt % solution, solvent: ½ mixture of methyl ethyl ketone with 1-methoxy-2-propanol) | 100.0 parts |
| Dodecapropylene glycol diacrylate | 15.0 parts |
| Tetraethylene glycol dimethacrylate | 3.5 parts |
| p-Toluenesulfonamide | 1.2 parts |
| 4,4'-Bis(diethylamino)benzophenone | 0.12 parts |
| Benzophenone | 2.3 parts |
| 2-(2'-Chlorophenyl)-4,5-diphenylimidazole dimer (25 wt % dichloromethane solution) | 4.5 parts |
| Tribromomethylphenylsulfone | 0.25 parts |
| Leuco Crystal Violet | 0.25 parts |
| Malachite Green | 0.02 parts |

COMPARATIVE EXAMPLE 3

A roll of copper alloy web having the same size and the same composition as in Example 2 was subjected to the surface treatment under the same condition as in Example 2, coated with the same light-sensitive solution as in Example 2 and dried (without coating the overcoat solution), then wound into a roll in a length of 2,000 m.

Thereafter, the roll was stored for 20 days under the same condition as in Example 2, and then cut into sheets having a length of 500 mm. Slight adhesion was observed on the upper part of the initial sheet, while it was observed that the 500th sheet had adhesion marks on both surfaces covering at least 30% of the plate area.

On the other hand, the same film original as used in Example 1 was placed on each of five samples prepared by cutting into sheets having a length of 500 mm without winding into a roll after the coating operation, and evacuated to bring them into contact with each other. The time required of each sample for close contact is shown in Table 2.

TABLE 2

| Sample No. | Time required for complete contact |
|---|---|
| 1 | 63 sec. |
| 2 | 68 sec. |
| 3 | 72 sec. |
| 4 | 86 sec. |
| 5 | 75 sec. |
| on average | 72.8 sec. |

In addition, there was observed an indication in the central part that the air was not completely evacuated.

EXAMPLE 3

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. Then, the surface thereof was grained using a nylon brush and a 400 mesh pumice-water suspension, and washed thoroughly with water. In order to remove the smut generated thereon, the surface was neutralized with 20% nitric acid solution, and rinsed, thereby preparing a substrate. The thus obtained substrate was coated with the following light-sensitive solution, dried, and then wound into a roll in a length of 2,000 m.

| Light-sensitive Solution Composition | |
|---|---|
| 2-Hydroxyethyl methacrylate copolymer | 0.87 g |
| Salt of a mixture of p-diazodiphenylamine and paraformaldehyde with 2-methoxy-4-hydroxy-5-benzoylbenzenesulfonic acid | 0.1 g |
| Oil Blue #603 (trade name) | 0.03 g |
| Methanol | 6 g |
| 2-Methoxyethanol | 6 g |

The web was fed from the roll set at an unwinder and was cut off at every length of 500 mm, and 1,000 sheets of Samples $A_1$ to $A_{1000}$ were prepared.

Each of these Samples $A_1$ to $A_{1000}$ was used as the lead-frame forming metal plate. An etching pattern image forming film original plate was brought into contact with the light-sensitive layer of each sample, and the light-sensitive layer was exposed to light and developed to remove the unexposed part thereof. Thereafter, the lead-frame forming material plate was dipped in an etching solution of ferric chloride, and the etched part was removed therefrom. Thus, 1,000 sheets of a desired lead-frame were prepared.

COMPARATIVE EXAMPLE 4

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, then wound into a roll in a length of 2,000 m.

| Light-sensitive Solution Composition | |
|---|---|
| 2-Hydroxyethyl methacrylate copolymer | 0.87 g |
| Salt of a mixture of p-diazodiphenylamine and paraformaldehyde with 2-methoxy-4-hydroxy-5-benzoylbenzenesulfonic acid | 0.1 g |
| Oil Blue #603 (trade name) | 0.03 g |
| Methanol | 6 g |
| 2-Ethoxyethanol | 6 g |

The web was fed from the roll set at an unwinder and was cut off at every length of 500 mm, and 1,000 sheets of Samples $B_1$ to $B_{1000}$ were prepared.

The thus obtained Samples $B_1$ to $B_{1000}$ were processed in the same manner as in Example 3 to prepare 1,000 sheets of a desired lead-frame.

1,000 sheets of lead-frames prepared in Example 3 and 1,000 sheets of lead-frames prepared in Comparative Example 4 were observed for the numbers of microscopic film peelings and pinholes generated in the coat. The result is shown below.

| | Film peeling | Pinholes |
|---|---|---|
| $A_1$ to $A_{1000}$ | 3 | 4 |
| $B_1$ to $B_{1000}$ | 23 | 75 |

Thus, effects produced by fine roughness on the substrate surface were observed clearly.

EXAMPLE 4

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, then wound into a roll in a length of 2,000 m.

| Light-sensitive Solution Composition | |
|---|---|
| Copolymer of N-[2-(methacryloyloxy)ethyl]-2,3-dimethylmaleimide with methacrylic acid | 0.87 g |
| Oil Blue #603 (trade name) | 0.03 g |
| Methanol | 6 g |
| 2-Methoxyethanol | 6 g |

The web fed from the roll as described above set at an unwinder was cut off at every length of 500 mm, and thereby were prepared 1,000 sheets of Samples $C_1$ to $C_{1000}$.

Each of these samples $C_1$ to $C_{1000}$ was used as the lead-frame forming material plate. An etching pattern image forming film original plate was brought into contact with the light-sensitive layer of each sample, and the light-sensitive layer was exposed to light and developed to remove the unexposed part thereof. Thereafter, the lead-frame forming material plate was dipped in an etching solution of ferric chloride, and the etched part was removed therefrom. Thus, 1,000 sheets of a desired lead-frame were prepared.

Samples $C_1$ to $C_{1000}$ thus prepared and Samples $A_1$ to $A_{1000}$ prepared in Example 1 were observed for the frequency of scratches and press marks on the plate surface.

As for Samples $A_1$ to $A_{1000}$, the generation of scratches was observed in six sheets, and the generation of press marks in three sheets.

As for Samples $C_1$ to $C_{1000}$, on the other hand, the generation of scratches was observed in two sheets, and the generation of press marks in one sheet.

Thus, it was confirmed that the light-sensitive material of this example is superior to the diazo salt light-sensitive resin in film strength.

On the other hand, $C_1$ to $C_{1000}$ provided only three sheets of rejected articles caused by reattachment of dust, resist, etc. Thus, similarly to Example 1, this example was far superior to Comparative Example 1.

EXAMPLE 5

A 0.15 ram-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, then wound into a roll in a length of 2,000 m.

| Light-sensitive Solution Composition | |
|---|---|
| Metaparacresol novolak resin | 5 g |
| Nikalac (trade name, available from Sanwa Chemical) | 1.25 g |
| Diphenyliodonium·$PF_6$ salt | 0.15 g |
| Oil Blue #603 (trade name) | 0.03 g |
| Anthracene | 0.015 g |
| Ethylene glycol monomethyl ether | 2.3 g |

The web was fed from the roll set at an unwinder and was then cut into sheets to prepare samples. The samples thus prepared were then exposed to ultraviolet rays through a resolving power mask.

The resulting samples were developed with a 2.3% aqueous solution of tetramethyl ammonium hydroxide (TMAH), washed with water, and then dried.

As a result, L/S patterns were resolved down to 20 μm.

EXAMPLE 6

The plate prepared in Example 1 was exposed to ultraviolet rays through a resolving power mask, developed with an aqueous solution of sodium silicate ($SiO_2/Na_2O=1.74$), washed with water, and then dried.

As a result, L/S patterns were resolved down to 40 μm.

Thus, it showed that the second embodiment of the present invention provides a high resolving power.

On the other hand, a roll of the same sample which had been wound in the same manner as in Example 1 was unwound, and the web was cut off at every length of 500 mm, and 1,000 sheets were prepared, and 1,000 sheet of a lead-frame were prepared in the same manner as in Example 1. These 1,000 sheets provided only four sheets of rejected articles caused by reattachment of dust, resist, etc. Thus, similarly to Example 1, this example was far superior to Comparative Example 1.

As described above, the present invention can solve the problems of quality and productivity which confront the conventional methods of forming lead-frames.

While the invention has been described in detail and with reference to specific embodiments thereof, it will be apparent to one skilled in the art that various changes and modifications can be made therein without departing from the spirit and scope thereof.

What is claimed is:

1. A lead-frame forming material which is prepared by providing fine roughness of from 0.05 µm to 1 µm on the surface of a metal web made of copper, copper alloy or nickel alloy, coating a light-sensitive material on both sides of the metal web made of copper, copper alloy or nickel alloy to form a coated light-sensitive layer, drying the coated layer, providing protrusions having a height of from 0.5 µm to 30 µm on the surface of the light-sensitive layer, and winding into a roll or cutting off at a fixed length and stacking thereof, wherein the light-sensitive material comprises (1) a diazo salt light-sensitive resin and (2) a water-insoluble but alkaline water-soluble lipophilic high molecular weight compound having a molecular weight of from about 10,000 to about 200,000.

* * * * *